(12) United States Patent
Chen

(10) Patent No.: US 6,535,043 B2
(45) Date of Patent: Mar. 18, 2003

(54) CLOCK SIGNAL SELECTION SYSTEM, METHOD OF GENERATING A CLOCK SIGNAL AND PROGRAMMABLE CLOCK MANAGER INCLUDING SAME

(75) Inventor: Minhan Chen, Morrisville, NC (US)

(73) Assignee: Lattice Semiconductor Corp, Hillsboro, OR (US)

(*) Notice: Subject to any disclaimer, the term of this patent is extended or adjusted under 35 U.S.C. 154(b) by 0 days.

(21) Appl. No.: 09/863,656

(22) Filed: May 23, 2001

(65) Prior Publication Data

US 2001/0055357 A1 Dec. 27, 2001

Related U.S. Application Data

(60) Provisional application No. 60/207,371, filed on May 26, 2000.

(51) Int. Cl.[7] ................................................. H03K 3/00
(52) U.S. Cl. ........................ 327/291; 327/299; 327/261; 327/175
(58) Field of Search ................................. 327/291, 293, 327/295, 298, 156, 158, 269, 271, 277, 99, 407, 172, 173, 174, 175, 31, 35, 36, 355, 356, 360, 361; 331/48, 49, 50, 60, 61

(56) References Cited

U.S. PATENT DOCUMENTS

| | | | | |
|---|---|---|---|---|
| 5,097,489 A | * | 3/1992 | Tucci | 375/120 |
| 5,552,733 A | * | 9/1996 | Lesmeister | 327/295 |
| 5,576,652 A | * | 11/1996 | Boehlke | 327/254 |
| 5,712,585 A | * | 1/1998 | Jeong | 327/293 |
| 5,717,362 A | * | 2/1998 | Maneatis et al. | 331/57 |
| 5,945,862 A | * | 8/1999 | Donnelly et al. | 327/278 |
| 6,061,418 A | * | 5/2000 | Hassoun | 377/47 |
| 6,087,868 A | * | 7/2000 | Millar | 327/156 |
| 6,100,735 A | * | 8/2000 | Lu | 327/158 |

* cited by examiner

Primary Examiner—Timothy P. Callahan
Assistant Examiner—An T. Luu

(57) ABSTRACT

For use with a programmable clock manager (PCM), a selection system and method of generating a clock signal. In one embodiment, the selection system includes a phase selector, having multiple taps, configured to generate multiple phase shifted signals from a reference signal corresponding to an input signal with a fixed phase shift therebetween. The phase selector is further configured to select at least two of the phase shifted signals. The selection system further includes a duty cycle synthesis circuit configured to generate a clock signal having a duty cycle as a function of a phase shift between the selected phase shifted signals.

20 Claims, 4 Drawing Sheets

CLOCK SIGNAL SELECTION SYSTEM, METHOD OF GENERATING A CLOCK SIGNAL AND PROGRAMMABLE CLOCK MANAGER INCLUDING SAME

CROSS-REFERENCE TO RELATED APPLICATION

This Application claims the benefit of U.S. Provisional Application Ser. No. 60/207,371, filed on May 26, 2000, and entitled "Novel Field Programmable Gate Array" commonly assigned with the present invention and incorporated herein by reference.

TECHNICAL FIELD OF THE INVENTION

The present invention is directed, in general, to logical devices and, more specifically, to a clock signal selection system, a related method of generating a clock signal and a programmable clock manager including the system or the method.

BACKGROUND OF THE INVENTION

Modern digital electronic computers include a number of cooperating sequential logic circuits that each perform several routine operations, and are each controlled by derivatives of a common clock signal. The clock signals should be synchronized at predetermined locations within the system to help optimize computer function. Although the individual clock signals may have a common source, they often do not arrive at their intended destinations in proper synchronism, for example due to variations in signal propagation delay for each destination. Thus, combining several complex sequential logic circuits within a system presents a challenge with respect to synchronizing the time frames between the respective circuits therein.

Because synchronous sequential logic circuits change states at the rising or falling edge of a synchronous clock signal, proper circuit operation often demands that any external input signals to the synchronous sequential logic circuit generate valid inputs that occur with the proper set up time and hold time requirements relative to the designated clock edge. However, in a system including sequential logic circuits having a master system clock that operates the several diverse system circuits, there is often a problem with skew (different amounts of delay in different portions of the device) between the system clock and the destination clock signals propagating through the various circuits.

As higher density programmable logic devices (PLDs) become available, on-chip clock distribution becomes more important to the integrity and performance of the designs implemented in these devices. Unfortunately, with the advent of high-density PLDs, such as a field programmable gate array (FPGA), difficulties in managing clock delay and clock skew associated with these devices has become substantial. Many existing solutions for these problems, such as hardwired clock trees, are less effective for the high density PLDs found in today's programmable logic market. As integration levels of microelectronic circuits and system complexity continues to increase, the routing or distribution of a master system clock has become even more critical. This challenge is especially exacerbated in view of ever increasing clock rates in today's powerful microprocessors.

A common solution to these problems is the incorporation of a programmable clock manager (PCM) into the PLDs themselves. A PCM may be used to adjust the clock frequency, the clock phase and the clock duty cycle for system clocks. Conventional PCMs may be found in either Phase-Locked-Loop (PLL) or Delay-Locked-Loop (DLL) architecture to assist in synchronizing clock signals in the PLD. Although DLL circuitry may be used to resolve some of the problems in today's PLDs, employing a voltage controlled oscillator (VCO) to create a PLL architecture has continued to gain popularity among device designers, primarily due to its frequency synthesis capability.

A VCO generally adjusts the various signals, such that the edges of the internal clock signals are aligned with those of a master clock signal, even though the time frame of each signal is thereby shifted. The PLL architecture provides feedback that is used to nullify clock distribution delays within the circuit by comparing the phase of a master clock signal with that of a feedback signal. The difference between the two signals is used in a feedback control system to bring the first and second signals into a fixed phase relation. Logical elements such as an AND gate and divider logically combine the master clock signal with the feedback signal to provide a synchronization signal for the system. More specifically, the master clock signal is compared with the feedback signal and a reference (synchronization) signal is generated in response to the difference. Delay circuitry may be used to produce delays in the output clock signal based on a selected delay time, depending on the application of the output clock signal. Alternatively, delay compensation may be used to synchronize the master clock and feedback signals based on the reference signal. In this way, all circuits of the device receive synchronous clock signals and clock signal skew is reduced.

Although capable of performing such delay compensation, even the most advanced PCMs, whether employing PLL or DLL architecture, are unable to coordinate such delay compensation with other important functions such as frequency synthesis and duty cycle synthesis. Frequency synthesis involves altering the frequency of the output clock signal of the PCM with respect to the frequency of the master clock signal. Duty cycle synthesis involves selecting a duty cycle (e.g., the on/off time of a signal, independent of its frequency) of the output clock signal based on a desired application.

In conventional devices, multiple PCMs have been incorporated to perform all three functions within a system. Of course, with an increase in the number of PCMs employed in a programmable device comes a corresponding increase in the cost of manufacturing. These increased costs are inevitably passed down to the consumers. Alternatively, a combination of the PLL with DLL architectures have been attempted, but again resulting in increased manufacturing costs.

Accordingly, what is needed in the art is a PCM capable of performing frequency synthesis and duty cycle synthesis, as well as delay compensation, without suffering from the deficiencies found in the prior art.

SUMMARY OF THE INVENTION

To address the above-discussed deficiencies of the prior art, the present invention provides a selection system for use with a programmable clock manager (PCM) having an input signal. In one embodiment, the selection system includes a phase selector, having multiple taps, configured to generate multiple phase shifted signals from a reference signal corresponding to the input signal with a fixed phase shift therebetween. The phase selector is further configured to select at least two of the phase shifted signals. The selection system further includes a duty cycle synthesis circuit configured to generate a clock signal having a duty cycle as a function of a phase shift between the selected phase shifted signals.

In another aspect, the present invention provides a method of generating a clock signal. In this embodiment, the method includes developing multiple phase shifted signals, having a fixed phase shift therebetween, from a reference signal, selecting at least two of the phase shifted signals, and generating the clock signal having a duty cycle as a function of a phase shift between the selected phase shifted signals.

In yet another aspect, the present invention provides a PCM including a comparator circuit configured to determine whether a frequency and a phase of a feedback signal are substantially equal to a frequency and a phase of an input signal. In addition, the PCM includes a selection system having a phase selector, with multiple taps, configured to generate multiple phase shifted signals from a reference signal corresponding to the input signal with a fixed phase shift therebetween. The phase selector is further configured to select at least two of the phase shifted signals. The selection system also includes a duty cycle synthesis circuit configured to generate a clock signal having a duty cycle as a function of a phase shift between the selected phase shifted signals.

The foregoing has outlined, rather broadly, preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

BRIEF DESCRIPTION OF THE DRAWINGS

For a more complete understanding of the present invention, reference is now made to the following detailed description taken in conjunction with the accompanying FIGUREs. It is emphasized that various features may not be drawn to scale. In fact, the dimensions of various features may be arbitrarily increased or reduced for clarity of discussion. Reference is now made to the following descriptions taken in conjunction with the accompanying drawings, in which.

DETAILED DESCRIPTION

Figure 1:
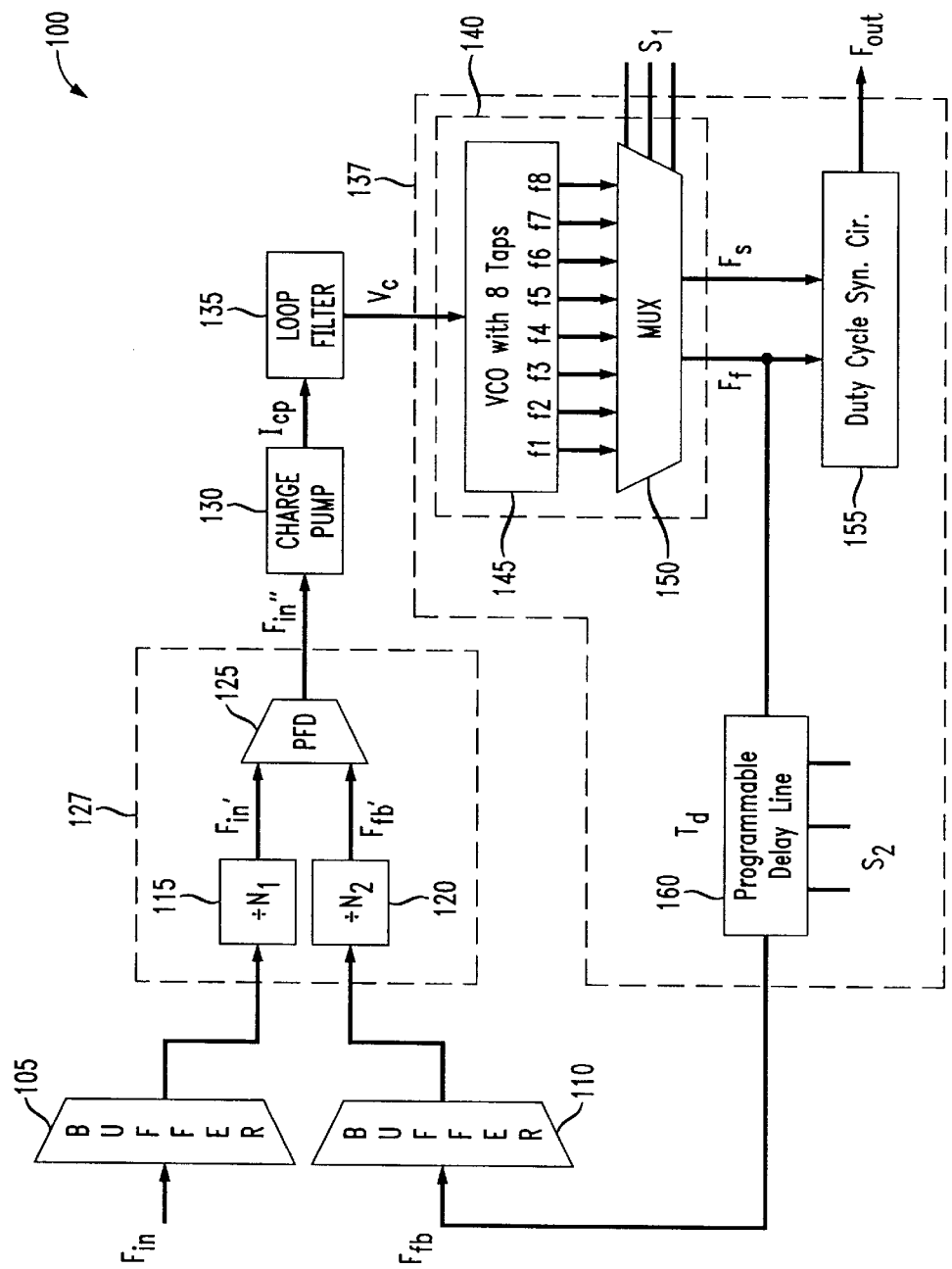
FIG. 1 illustrates a high level block diagram of one embodiment of a programmable clock manager constructed according to principles of the present invention.

Referring initially to FIG. 1, illustrated is a high level block diagram of one embodiment of a programmable clock manager (PCM) 100 constructed according to principles of the present invention. The PCM 100 accepts an input signal (e.g., a master clock signal) $F_{in}$ and a feedback signal $F_{fb}$, and includes first and second buffers 105, 110 located at the input of the PCM 100.

In the illustrated embodiment of the present invention, the PCM 100 includes first and second signal dividers 115, 120, and a phase and frequency detector (PFD) 125 used for comparing both the phase and the frequency of signals input to the PCM 100. In the illustrated embodiment, the first and second signal dividers 115, 120 and the PFD 125 form a comparator circuit 127. Of course, other types of comparator circuits, having different components, may be used to determine differences in signals, and the present invention is not limited to any particular one. The output from the PFD 125 is a reference signal $F_{in}"$, which is input to a charge pump 130 that generates a current signal $I_{cp}$, and a loop filter 135 that generates a filtered DC voltage control signal $V_c$, based on the reference signal $F_{in}"$. Of course, other components capable of producing such signals may alternatively be used.

The PCM 100 also includes a selection system 137 having a phase selector 140, a duty cycle synthesis circuit 155, and a delay compensation circuit (e.g., a programmable delay line (PDL) 160). In an advantageous embodiment, the phase selector 140 includes a multi-tap differential voltage-controller oscillator (VCO) 145, as well as a multiplexer 150. Depending on the embodiment, the multiplexer 150 may be programmable either "on-the-fly" or when initially configured, using a signal $S_1$, for example, a 3-bit signal. A fixed signal $F_f$ from a first tap f1 and a selected signal $F_s$ from one of the remaining taps f2–f8 are selected by and shown at the output of the phase selector 140. Both signals $F_f$, $F_s$ provide the inputs to the duty cycle synthesis circuit 155 from which a desired output clock signal $F_{out}$ is generated. In addition, the PDL 160 is positioned within a feedback loop formed with the fixed signal $F_f$ from the first tap f1, which becomes the feedback signal $F_{fb}$. The PCM 100 functions as follows.

In accordance with the present invention, the input signal $F_{in}$ and the feedback signal $F_{fb}$ are fed into the first and second buffers 105, 110, respectively. In one embodiment, the input signal $F_{in}$ is then divided with the first divider 115, while the feedback signal $F_{fb}$ is divided by the second divider 120. In alternative embodiments, the input and feedback signals $F_{in}$, $F_{fb}$ may be fed into the comparator circuit 127 without being divided or other operations may be performed thereon. After passing through the dividers 115, 120, a divided input signal $F_{in}'$ and a divided feedback signal $F_{fb}'$ are fed into the PFD 125. In accordance with conventional practice, the PFD 125 compares the divided input signal $F_{in}'$ with the divided feedback signal $F_{fb}'$. In this comparison, both the phase and the frequency of the two signals $F_{in}'$, $F_{fb}'$ are compared to one another, and a reference signal $F_{in}"$ is generated based on this comparison.

The reference signal $F_{in}"$ is input to the charge pump 130, and based on this signal $F_{in}"$, the charge pump 130 generates the current signal $I_{cp}$, which is input to the loop filter 135. The loop filter 135, in turn, filters the current signal $I_{cp}$ of the charge pump 130 and converts it into a voltage signal, such the pure DC voltage control signal $V_c$ illustrated in FIG. 1. In short, a control signal for the VCO 145 is generated based on the reference signal $F_{in}"$. It should be understood, therefore, that the voltage control signal $V_c$ is generally another form of the reference signal $F_{in}"$.

In an exemplary embodiment of the present invention, the current and control signals $I_{cp}$, $V_c$ generated by the charge pump 130 and the loop filter 135, respectively, vary based on the comparison of the divided input signal $F_{in}'$ and the divided feedback signal $F_{fb}'$ (which produces the reference signal $F_{in}''$). More specifically, if the divided input signal $F_{in}'$ and the divided feedback signal $F_{fb}'$ are substantially equal in phase and frequency, the voltage control signal $V_c$ generated will have a particular voltage level. Such level for the voltage control signal $V_c$ would result in the phase and frequency of the fixed signal $F_f$ from the first tap f1 of the phase selector 140 remaining substantially equal to the input signal $F_{in}$, thus locking the PCM 100 in a "phase-locked loop" with respect to the first tap f1.

However, if the frequency of the two divided signals $F_{in}'$, $F_{fb}'$ is found to differ, a different voltage control signal $V_c$ will be generated to indicate the nonsynchronous frequencies. Likewise, if the phase of the two divided signals $F_{in}'$, $F_{fb}'$ is found to differ, another different voltage control signal $V_c$ will be generated to indicate the difference in phase. Finally, if both the phase and the frequency of the divided input signal $F_{in}'$ and the divided feedback signal $F_{fb}'$ differ, yet another voltage control signal $V_c$ will be generated indicating these differences. In advantageous embodiments, the voltage control signal $V_c$ increases as a difference in either or both the phase and frequency of the divided input signal $F_{in}'$ with respect to those of the divided feedback signal $F_{fb}'$, and vice versa. Then, whether the phase and/or frequency of the two divided signals $F_{in}'$, $F_{fb}'$ differ or are substantially equal, the generated voltage control signal $V_c$ is input to the phase selector 140.

Using the voltage control signal $V_c$ generated from the reference signal $F_{in}''$, the VCO 145 of the phase selector 140 may configure each signal from its fixed taps f1, f2, f3, f4, f5, f6, f7, f8 to maintain substantially the same frequency as the input signal $F_{in}$. In addition, unless a delay is desired, the VCO 145 ensures that a fixed signal $F_f$ of the first tap f1 is substantially in phase with the input signal $F_{in}$, and that each of the signals of the remaining fixed taps f2–f8 maintain substantially a 45° (⅛) phase difference with respect to the reference signal $F_{in}''$ and with respect to each other. More specifically, since only eight taps are illustrated, each tap provides a signal having a 45° phase shift (360°/8) from a prior signal. How the VCO 145 maintains a substantially fixed phase difference between each of the signals of the fixed taps f1–f8 (45° in the illustrated embodiment) will be described in greater detail with respect to FIG. 2. Although a VCO 145 having only eight fixed taps f1–f8 is illustrated, those skilled in the art understand that a VCO, or similar device, having greater or fewer output taps may be used, depending on the desired phase difference between the signals generated by the taps, without departing from the broad scope of the present invention.

Next, the multiplexer 150 is used to select signals from the fixed taps f1–f8 to be combined and arrive at the desired output clock signal $F_{out}$. More precisely, the multiplexer 150 is used to select the fixed signal $F_f$ of the first tap f1 and a selected signal $F_s$ generated from one of the remaining taps f2–f8, depending on the desired duty cycle (established by a corresponding phase difference) for the final output clock signal $F_{out}$. Regardless of which remaining fixed taps f2–f8 is selected along with the first tap f1, the VCO 145 may be configured to ensure the two signals from the two taps have the same frequency. As illustrated, the multiplexer 150 is configured to select the signals of the two taps using the signal $S_1$, which is illustrated as a 3-bit signal. In an advantageous embodiment, the multiplexer 150 is programmable "on-the-fly," during use of the PCM 100. In an alternative embodiment, however, the multiplexer 150 may be configured to select the signals $F_f$, $F_s$ from the fixed taps f1–f8 when it is initialized. Of course, the present invention is broad enough to encompass either configuration or others for the multiplexer 150.

Once the multiplexer 150 has selected the fixed signal $F_f$ of the first tap f1 and the selected signal $F_s$ (a phase shifted signal) of one of the remaining fixed taps f2–f8, the two signals $F_f$, $F_s$ are fed into the duty cycle synthesis circuit 155. The duty cycle synthesis circuit 155 then combines the two signals $F_f$, $F_s$ into a single signal having the desired duty cycle, the output clock signal $F_{out}$. The frequency of the output clock signal $F_{out}$ may still be substantially equal to that of the fixed taps f1–f8 of the VCO 145, as well as that of the input signal $F_{in}$. In contrast, however, the duty cycle of the output clock signal $F_{out}$ is configured by the duty cycle synthesis circuit 155 based on the phase difference between the signals $F_f$, $F_s$ from the first tap f1 and the other selected tap f2–f8. This process will be described in greater detail with respect to FIG. 3.

The PCM 100 illustrated in FIG. 1 may also be used in frequency synthesis applications. In the phase-locked condition, the frequency of the divided input signal $F_{in}'$ equals the frequency of the divided feedback signal Ffb'. Using the first and second dividers 115, 120, the following relationships exist among the frequencies of the illustrated signals.

$$F_{in}' = \frac{F_{in}}{N_1} \text{[0031]} \quad F_{fb}' = \frac{F_{fb}}{N_2} \quad F_{fb} = F_f = F_{out}$$

In the above equations, $N_1$ and $N_2$ represent integers used to divide the input signal $F_{in}$ and feedback signal $F_{fb}$, respectively. Thus, the dividing ratio of the output signal $F_{out}$ may be derived from the following equation.

$$F_{out} = \frac{N_2}{N_1}(F_{in})$$

By choosing various values ($N_1$ and $N_2$) for the first and second dividers 115, 120, the frequency of the output signal $F_{out}$ may be synthesized with the frequency of the input signal $F_{in}$ with a multiplier of $N_2/N_1$.

In an advantageous embodiment, the fixed signal $F_f$ may also be input to the PDL 160 of a feedback loop. The PDL 160 may be configured to produce a time delay $T_d$ between the fixed signal $F_f$ and the reference signal $F_{in}''$. The amount of delay $T_d$ produced by the PDL 160 may be selected using the delay signal $S_2$, which in the illustrated embodiment is also a 3-bit signal. Although not required with the practice of the present invention, if a delay $T_d$ is chosen, the fixed signal $F_f$ will no longer be kept in phase with the reference signal $F_{in}''$. Rather, the fixed signal $F_f$ will be kept out of phase with the reference signal $F_{in}''$ by the amount of delay $T_d$. In addition, the signals of the remaining seven taps f2–f8 will each remain 45° out of phase with respect to the fixed signal $F_f$ of the first tap f1, as well as each other. Those skilled in the art understand the importance of delay compensation capability, and the effects of such a delay $T_d$ will be discussed further with respect to FIG. 4. Finally, with a delay $T_d$ or not, the signal output from the PDL 160 is input back into the PCM 100 as the feedback signal $F_{fb}$, where the comparison process described above is repeated.

Figure 2:
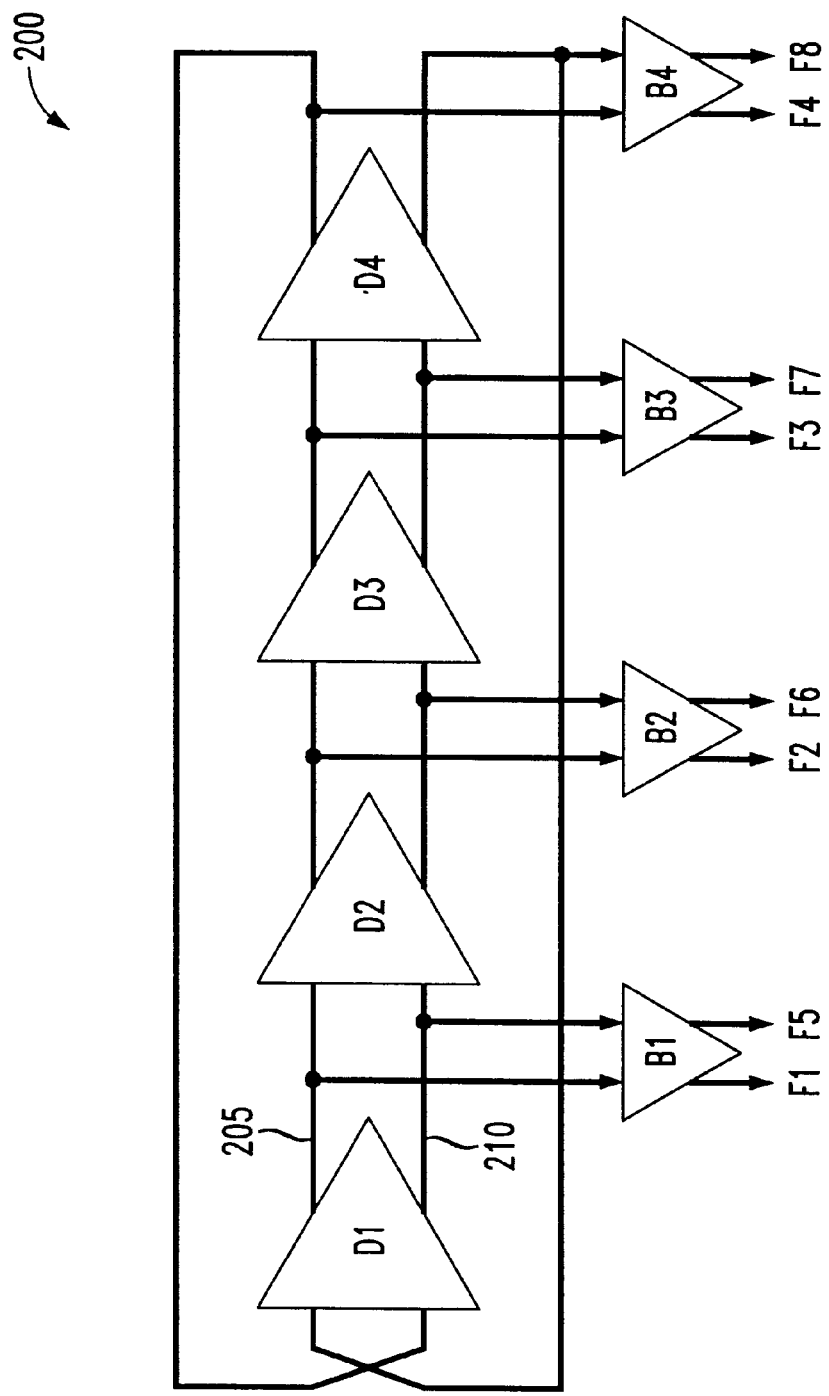
FIG. 2 illustrates one embodiment of a fully differential voltage-controlled oscillator for use with a programmable clock manager constructed according to the present invention.

Looking now at FIG. 2, illustrated is one embodiment of a fully differential VCO 200 for use with a PCM constructed according to the present invention. In the illustrated embodiment, the VCO 200 includes first, second, third and fourth delay stages D1, D2, D3, D4. Each of the delay stages D1, D2, D3, D4 represents a 45° (⅛) delay (or phase shift) in the signal passing through the VCO 200. The VCO 200 also includes a low path 205 and a high path 210, 180° out of phase with each other, through which the signals travel. The VCO 200 still further includes first, second, third and fourth single-ended signal buffers B1, B2, B3, B4.

As a reference signal is generated from a comparator circuit, for example the voltage control signal $V_c$ generated by the comparator circuit 127, the charge pump 130 and the loop filter 135 of FIG. 1, that signal is input to the VCO 200. As before, the signal is based on a difference (or lack of difference) between a master clock signal and a feedback signal. The control signal then proceeds through the VCO 200 beginning with the low path 205. When the signal passes through the first delay stage D1, the signal is phase shifted 45° by delaying the signal ⅛ of a total time "T" (or T/8). That phase shifted signal is then fed into the second delay stage D2. In addition, the signal is tapped out of the VCO 200 as a fixed signal $F_f$ for a first tap f1, before the second delay stage D2, and fed through the first buffer B1.

As with the first delay stage D1, the second delay stage D2 delays the signal another ⅛ of the total time T (for a total delay of T/4). This second delay in the signal brings the signal another 45° out of phase from the original signal that entered the VCO 200, for a total phase shift of 90°. This signal is then fed into the third delay stage D3, as well as tapped out as the signal for a second tap f2. The signal for the second tap f2 is fed through the second buffer B2. The third delay stage D3 adds another 45° phase shift and ⅛ T delay to the signal, and is fed into the fourth delay stage D4 and tapped out as the signal for a third tap f3. This signal passes through the third buffer B3. The fourth delay stage D4 adds yet another 45° phase shift and ⅛ T delay to the signal, resulting in a total of 180° of phase shift from the original signal and a T/2 delay. This 180° phase shifted signal is then looped back and fed into the first delay stage D1 on the high path 210. Also, the signal is tapped out as the signal for a fourth tap f4 and fed through the fourth buffer B4.

Now following the high path 210, the signal, which has been phase shifted a total of 180° so far, again passes through the first delay stage D1 which adds another 45° of phase shift to the signal. The signal is tapped out at this point as the signal for a fifth tap f5 and fed through the first buffer, along with the fixed signal $F_f$. Since the latter signal was phase shifted 45° and the former signal is phase shifted 225°, the signals generated from the first and fifth taps f1, f5 maintain a 180° phase shift from one another (or T/2 delay). The first buffer B1 helps ensure output signals generated from these two taps f1, f5 maintain this degree of phase shift.

Likewise, the second, third and fourth delay stages D2, D3, D4 each phase shift the signal an additional 45° (T/8 delay). As such, sixth, seventh, and eighth taps f6, f7, f8 may be tapped after each of the delay stages D2, D3, D4 to create output signals phase shifted 270°, 315° and 360°, respectively. The second, third and fourth buffers B2, B3, B4 ensure signals from the second and sixth taps f2, f6, signals from the third and seventh taps f3, f7, and signals from the fourth and eighth taps f4, f8 maintain a 180° phase shift, respectively.

Although only four delay stages D1, D2, D3, D4 are illustrated, those skilled in the art understand that greater or fewer delay stages may be used to phase shift, and thus delay, a signal as it passes through the VCO 200. Of course, the addition or removal of delay stages in such embodiments would correspond to the amount of phase shift provided to the signal. For example, if six delay stages were used in the VCO 200 of FIG. 2, each stage would provide only 30° of phase shift (T/12) for the signal passing through, and would provide 12 output signals from 12 fixed output taps. Regardless of the number of delay stages, all the fixed taps present in the VCO 200 could be fed into a multiplexer (not illustrated), such as the multiplexer 150 described with respect to FIG. 1. The multiplexer would then select two of the tapped output signals to be used to generate a final output clock signal having a selected duty cycle based on a phase shift between the two selected phase shifted signals. As discussed above, such a multiplexer may be programmed on-the-fly or simply pre-configured.

Figure 3:
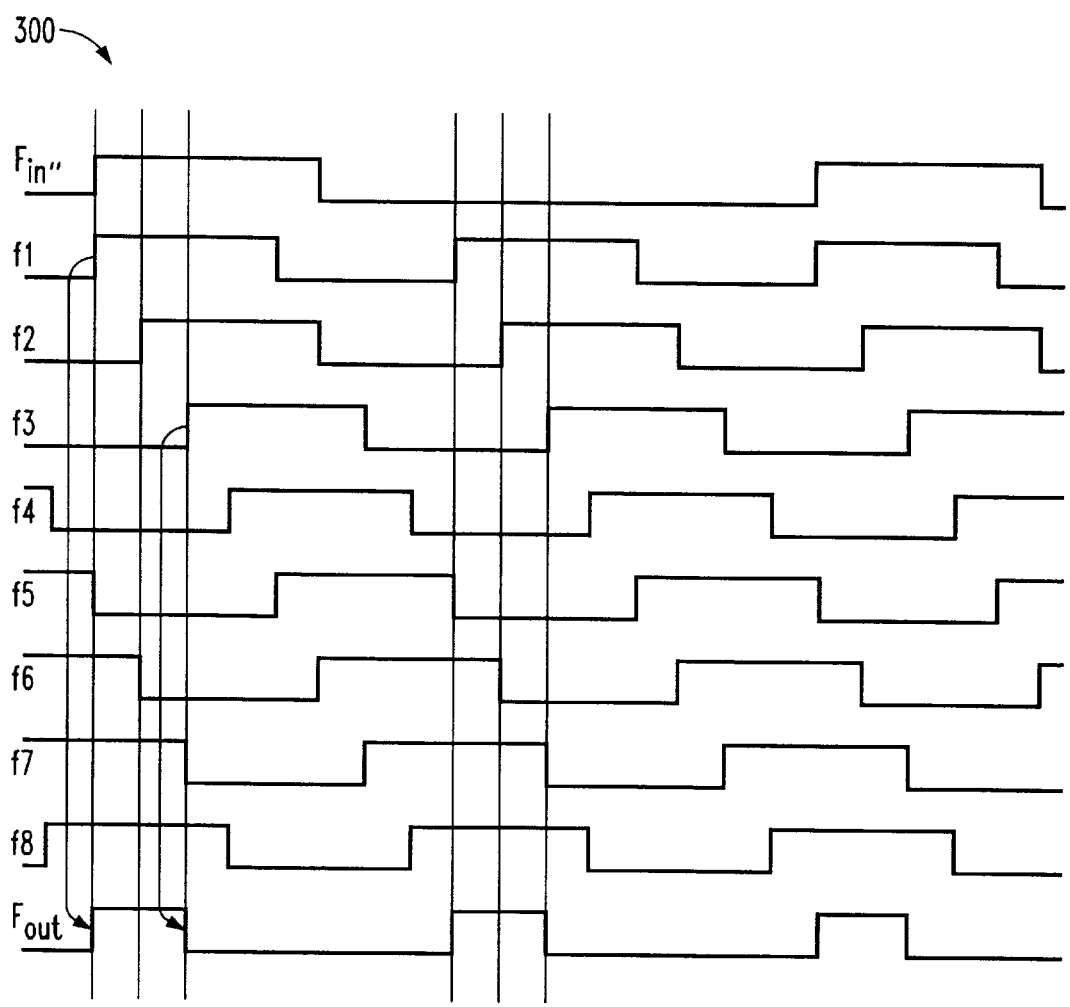
FIG. 3 illustrates a timing diagram of the relative phase shifts of the signals used by the programmable clock manager of FIG. 1 to generate an output clock signal having a selected duty cycle and frequency.

Turning now to FIG. 3, illustrated is a timing diagram 300 of the relative phase shifts of the signals used by the PCM 100 of FIG. 1 to generate an output clock signal $F_{out}$ having a selected duty cycle and frequency. The timing diagram 300 illustrates the reference signal $F_{in}"$ based on the input signal $F_{in}$, the signals from the eight fixed taps f1–f8, and the final output clock signal $F_{out}$. FIG. 3 is included to illustrate how the phase shift of the signals from two of the eight fixed taps f1–f8 may be used by the duty cycle synthesis circuit 155 to generate a output clock signal $F_{out}$ having the desired duty cycle and frequency.

In the exemplary embodiment illustrated in FIG. 3, assume the multiplexer 150 has been programmed to select the first tap f1 along with the third tap f3. If the fixed signal $F_f$ from the first tap f1 is considered to have no phase shift with respect to the reference signal $F_{in}"$ and the selected signal $F_s$ represented in this embodiment by the signal of the third tap f3 has a phase shift of 90°, then there is a total phase shift of 90° between the signals $F_f$, $F_s$ from these two taps f1, f3. In such an embodiment, the duty cycle synthesis circuit 155 could use the rising edge of the fixed signal $F_f$ as the rising edge of the output clock signal $F_{out}$. In addition, the duty cycle synthesis circuit 155 could use the rising edge of the selected signal $F_s$ from the third tap f3 as the falling edge of the output clock signal $F_{out}$. As illustrated, this example would result in the output clock signal $F_{out}$ having a phase shift of 90° from the reference signal $F_{in}"$, which would result in the output clock signal $F_{out}$ having a duty cycle of 25%. Of course, signals from other output taps f2–f8 may represent the selected signal $F_s$ and be combined with the fixed signal $F_f$ resulting in two selected signals to generate an output clock signal $F_{out}$ with more or less of a duty cycle, depending on the desired application.

Figure 4:
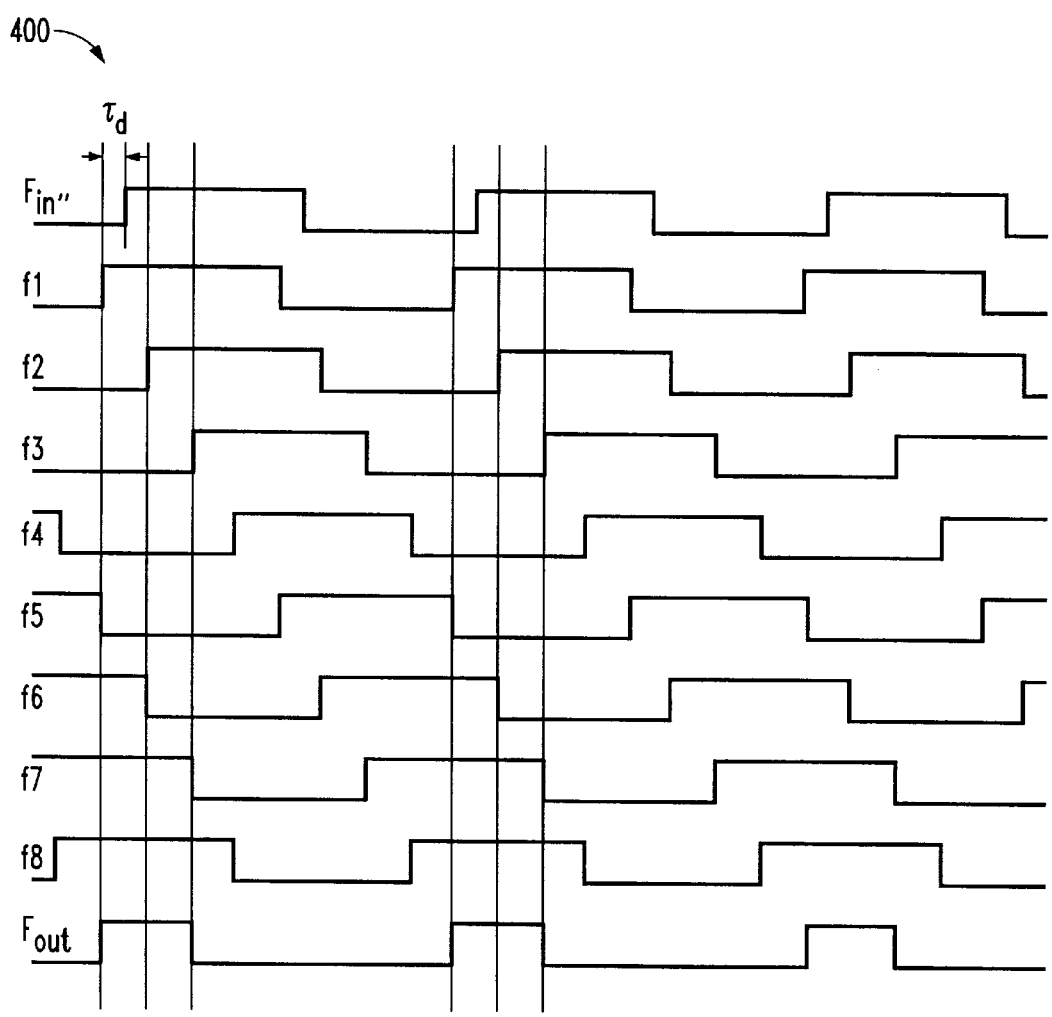
FIG. 4 illustrates is another timing diagram of the signals discussed with respect to FIG. 3, wherein a reference signal corresponding to an input signal is delayed.

Turning finally to FIG. 4, illustrated is another timing diagram 400 of the signals discussed with respect to FIG. 3, wherein the reference signal $F_r$ corresponding to the input signal $F_{in}"$ is negatively delayed. FIG. 4 is included to illustrate the time delay $T_d$ achievable using a PDL within the feedback loop of a PCM constructed according to the present invention.

More specifically, in some embodiments it may be desirable to create a negative time delay $T_d$ between the fixed signal $F_f$ and the reference signal $F_{in}"$ to deskew the system clocks. In such an embodiment, the time delay $T_d$ would shift the fixed signal $F_f$ ahead of the reference signal $F_{in}"$ by an amount equal to the time delay. Then, since the rising edge of the output clock signal $F_{out}$ remains in phase with the rising edge of the fixed signal $F_f$ from the first tap f1, the output clock signal $F_{out}$ is ahead of the reference signal $F_{in}"$ by the amount of the time delay $T_d$. Those skilled in the art understand the advantages associated with creating a negative delay between a reference signal and an output signal of a PCM. For instance, such a feature is often used in deskewing system clocks, as well as delay compensation. As a result, if desired, the output clock signal $F_{out}$ and the reference signal $F_{in}"$ may be delayed positively and/or negatively with respect to one another, without affecting the frequency or the duty cycle of either signal. In an exemplary embodiment, this delay may be created by incorporating a delay compensation circuit, such as the PDL 160 illustrated in FIG. 1, in the feedback loop of a PCM having a PLL architecture constructed in accordance with the principles of the present invention.

By providing a PCM capable of providing duty cycle synthesis, frequency synthesis, and delay compensation, the present invention surpasses the capabilities of the prior art. Such a PCM provides the benefits of all or any combination of these processes without the need for combining multiple PCMs in a single device. In addition, the need to combine PLL with DLL architecture, as has been attempted with questionable results, is eliminated. As a result, PCMs according to the present invention may be manufactured without the increased manufacturing costs often associated with programmable logic devices found in the prior art.

Although the present invention has been described in detail, those skilled in the art should understand that they can make various changes, substitutions and alterations herein without departing from the spirit and scope of the invention in its broadest form.

What is claimed is:

1. A selection system for use with a programmable clock manager (PCM) having an input signal, comprising:

a phase selector, having multiple taps, configured to generate corresponding multiple phase shifted signals from a reference signal corresponding to said input signal with a fixed phase shift therebetween, said phase selector further configured to select at least two of said phase shifted signals; and a duty cycle synthesis circuit configured to generate a clock signal having a duty cycle as a function of a phase shift between said selected phase shifted signals.

2. The selection system as recited in claim 1 wherein said phase selector comprises a voltage-controlled oscillator and a multiplexer.

3. The selection system as recited in claim 1 wherein said phase selector comprises a multi-tap fully differential voltage-controlled oscillator and a programmable multiplexer.

4. The selection system as recited in claim 1 wherein said phase selector comprises eight taps and said phase shifted signals have a 45 degree phase shift therebetween.

5. The selection system as recited in claim 1 further comprising a delay compensation circuit configured to create a delay in said reference signal.

6. The selection system as recited in claim 1 wherein said phase selector is further configured to modify a frequency of said phase shifted signals based on a frequency of said reference signal.

7. The selection system as recited in claim 1 wherein said phase selector is further configured to modify a frequency of said phase shifted signals based on a frequency of said reference signal from about 10 MHz to about 100 MHz.

8. A method of generating a clock signal, comprising:

developing multiple phase shifted signals, having a fixed phase shift therebetween, from a reference signal;

selecting at least two of said phase shifted signals; and generating said clock signal having a duty cycle as a function of a phase shift between said selected phase shifted signals.

9. The method as recited in claim 8 wherein said developing is performed by a voltage-controlled oscillator and said selecting is performed by a multiplexer.

10. The method as recited in claim 8 said developing is performed by a multi-tap fully differential voltage-controlled oscillator and said selecting is performed by a programmable multiplexer.

11. The method as recited in claim 8 wherein said phase shifted signals have a 45 degree phase shift therebetween.

12. The method as recited in claim 8 further comprising creating a delay in said reference signal.

13. The method as recited in claim 8 further comprising modifying a frequency of said phase shifted signals based on a frequency of said reference signal.

14. The method as recited in claim 13 wherein said modifying includes modifying a frequency of said phase shifted signals from about 10 MHz to about 100 MHz.

15. A programmable clock manager (PCM), comprising:

a comparator circuit configured to determine whether a frequency and a phase of a feedback signal are substantially equal to a frequency and a phase of an input signal; and a selection system, comprising:

a phase selector, having multiple taps, configured to generate multiple phase shifted signals from a reference signal corresponding to said input signal with a fixed phase shift therebetween, said phase selector further configured to select at least two of said phase shifted signals, and a duty cycle synthesis circuit configured to generate a clock signal having a duty cycle as a function of a phase shift between said selected phase shifted signals.

16. The PCM as recited in claim 15 wherein said comparator circuit comprises a signal divider and a phase and frequency detector.

17. The PCM as recited in claim 15 wherein said phase selector comprises a voltage-controlled oscillator and a multiplexer.

18. The PCM as recited in claim 15 wherein said phase selector comprises eight taps and said phase shifted signals have a 45 degree phase shift therebetween.

19. The PCM as recited in claim 15 wherein said selection system further comprises a delay compensation circuit configured to create a delay in said reference signal.

20. The PCM as recited in claim 15 wherein said phase selector is further configured to modify a frequency of said phase shifted signals based on a frequency of said reference signal.

* * * * *